(12) United States Patent
Feng

(10) Patent No.: US 7,954,075 B2
(45) Date of Patent: May 31, 2011

(54) VECTOR SEQUENCE SIMPLIFICATION FOR CIRCUIT VERIFICATION

(75) Inventor: Xiushan Feng, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 482 days.

(21) Appl. No.: 12/134,875

(22) Filed: Jun. 6, 2008

(65) Prior Publication Data
US 2009/0307643 A1 Dec. 10, 2009

(51) Int. Cl.
*G06F 17/50* (2006.01)
*G06F 9/45* (2006.01)

(52) U.S. Cl. ........ 716/104; 716/103; 716/106; 716/107; 716/110; 716/136; 703/2; 703/14; 703/15

(58) Field of Classification Search .................. 716/100, 716/103, 104, 106, 107, 110, 136; 703/2, 703/14, 15
See application file for complete search history.

(56) References Cited

U.S. PATENT DOCUMENTS

| | | | | |
|---|---|---|---|---|
| 6,308,299 B1* | 10/2001 | Burch et al. | .......... | 716/107 |
| 6,532,440 B1* | 3/2003 | Boppana et al. | .......... | 703/14 |
| 6,591,402 B1* | 7/2003 | Chandra et al. | .......... | 716/106 |
| 6,985,840 B1* | 1/2006 | Hsu et al. | .......... | 703/7 |
| 7,039,576 B2* | 5/2006 | Akita | .......... | 703/19 |
| 7,331,007 B2* | 2/2008 | Fine et al. | .......... | 714/741 |
| 7,428,715 B2* | 9/2008 | Fournier et al. | .......... | 716/136 |
| 7,475,367 B2* | 1/2009 | Wang et al. | .......... | 716/106 |
| 7,552,407 B2* | 6/2009 | Baumgartner et al. | ....... | 716/106 |
| 7,617,468 B2* | 11/2009 | Thakur et al. | .......... | 716/106 |
| 7,644,398 B2* | 1/2010 | Cleaveland et al. | .......... | 717/135 |
| 7,725,848 B2* | 5/2010 | Nebel et al. | .......... | 716/136 |
| 2008/0120072 A1* | 5/2008 | Bartz et al. | .......... | 703/2 |
| 2008/0127009 A1* | 5/2008 | Veneris et al. | .......... | 716/4 |
| 2008/0294953 A1* | 11/2008 | Cheng et al. | .......... | 714/726 |
| 2009/0106010 A1* | 4/2009 | Benjamin | .......... | 703/15 |
| 2010/0042385 A1* | 2/2010 | Fournier et al. | .......... | 703/6 |
| 2010/0229143 A1* | 9/2010 | Shi | .......... | 716/11 |

OTHER PUBLICATIONS

Chen et al.; "mplementation of a Symbolic Circuit Simulator for Topological Network Analysis"; Publication Year: 2006; Circuits and Systems, 2006. APCCAS 2006. IEEE Asia Pacific Conference on; pp. 1368-1372.*
Darbari; "Symmetry Reduction for STE Model Checking"; Publication Year: 2006; Formal Methods in Computer Aided Design, 2006. FMCAD '06; pp. 97-105.*
Shi et al.; "A Graph Reduction Approach to Symbolic Circuit Analysis"; Publication Year: 2007; Design Automation Conference, 2007. ASP-DAC '07. Asia and South Pacific; pp. 197-202.*
"Binary Decision Diagram", Wikipedia, downloaded from http://en.wikipedia.org/wiki/Binary_decision_diagram on Jun. 6, 2008, 6pages.

(Continued)

*Primary Examiner* — Helen Rossoshek

(57) ABSTRACT

One set of illegal vector sequences is manually generated for a circuit design and a symbolic simulator is used to automatically generate another set of illegal vector sequences for the circuit design. For verification purposes, the relationship between the manually generated set and the automatically generated set is determined. Prior to determining this relationship, one or both of the sets are simplified. One simplification technique includes replacing pairs of illegal vector sequences that are the same except at one bit position with a more general illegal vector sequence representative of both illegal vector sequences of the pair. Another simplification technique includes sorting the illegal vector sequences in a list having a sort order from most general to most specific and then identifying illegal vector sequences that are redundant in view of one or more other illegal vector sequences prior in the sort order based on a binary decision diagram (BDD)-based analysis that sequences through the sorted list in its sort order.

14 Claims, 5 Drawing Sheets

OTHER PUBLICATIONS

"Hamming Distance", Wikipedia, downloaded from http://en.wikipedia.org/wiki/Hamming_distance on Jun. 6, 2008, 3 pages.

"Quine-McCluskey Algorithim", Wikipedia, downloaded from http://en.wikipedia.org/wiki/Quine-McCluskey_algorithim on Jun. 6, 2008, 4 pages.

Hoxey "An Introduction to Symbolic Simulation", EETimes Online, downloaded from http://eetimes.com/showArticle.jhtml?articleID=175004754, on Jun. 6, 2008, 8 pages.

* cited by examiner

VECTOR SEQUENCE SIMPLIFICATION FOR CIRCUIT VERIFICATION

FIELD OF THE DISCLOSURE

The present disclosure relates generally to circuit simulation and verification and more particularly to verifying illegal vector sequences identified for a circuit design.

BACKGROUND

In the design of a particular circuit, the design engineer typically identifies a set of illegal vector sequences that, if applied to the corresponding input or inputs of the circuit in the corresponding sequence of one or more cycles, can trigger spurious or unpredictable circuit behavior. As part of the verification process, a symbolic simulator often is employed to generate a separate set of illegal vector sequences. The set of illegal vector sequences generated by the design engineer and the set of illegal vector sequences generated by the symbolic simulator then can be compared to ensure that there was not an error in either or both of the design engineer's analysis or the operation of the symbolic simulator. As part of this analysis, the relationship between the two sets is determined (i.e., whether the sets are equal, whether one set is inclusive of the other, or whether one or both sets include illegal vector sequences not found in the other set). This relationship then can be interpreted to verify the correct analysis of the design engineer and the correct operation of the symbolic simulator.

In many instances, the sets can include thousands, tens of thousands, or even millions of illegal vector sequences, thereby making a direct comparison of the two sets to determine their relationship memory-intensive and computationally difficult, thereby preventing the design engineer from efficiently evaluating the circuit designed. An improved technique for verifying the relationship between sets of illegal vector sequences therefore would be advantageous.

BRIEF DESCRIPTION OF THE DRAWINGS

The present disclosure may be better understood and its numerous features and advantages made apparent to those skilled in the art by referencing the accompanying drawings. The use of the same reference symbols in different drawings indicates similar or identical items.

DETAILED DESCRIPTION

Figure 1:
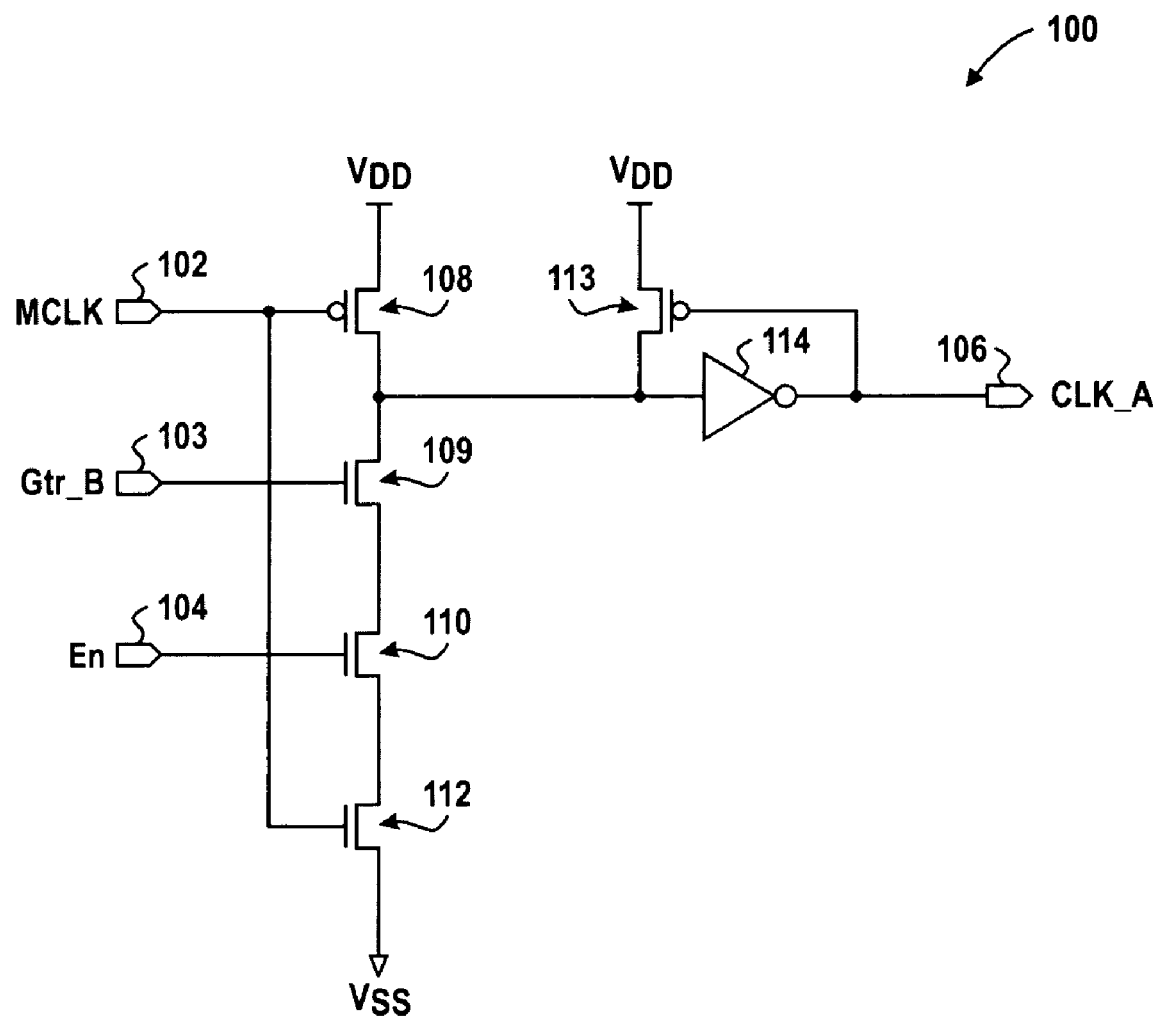
FIG. 1 is a circuit diagram illustrating an example circuit design for verification in accordance with at least one embodiment of the present disclosure.

FIGS. 1-5 illustrate example techniques for verifying illegal vector sequences for a circuit design. In one embodiment, a design engineer or other person analyzes the circuit design to manually generate a set of illegal vector sequences for the circuit design. In addition, a symbolic simulator is used to automatically generate another set of illegal vector sequences for the circuit design. In order to verify correct analysis of the circuit design on both the part of the design engineer and the circuit simulator, the relationship between the manually generated set and the automatically generated set is determined. However, each set may contain a significant number of illegal vector sequences, thereby making it difficult to determine the relationship between the two sets. Accordingly, in one embodiment one or both of the sets may be simplified via one or more simplification techniques before their relationship is determined. One of the simplification processes implemented can include, for example, replacing pairs of illegal vector sequences that are the same except at one bit position (i.e., within a hamming distance of one (1)) with a more general illegal vector sequence representative of both illegal vector sequences of the pair. The simplification process also can include, for example, sorting the illegal vector sequences in a list having a sort order from most general to most specific and then identifying illegal vector sequences that are redundant in view of one or more other illegal vector sequences prior in the sort order based on a binary decision diagram (BDD)-based analysis that sequences through the sorted list in its sort order. The resulting manually generated set and automatically generated set then can be compared to determine the relationship between the two sets. This relationship then can be interpreted to verify that either or both of the design engineer and the symbolic simulator correctly identified all of the possible illegal vector sequences for the circuit design.

For ease of illustration, the techniques of the present disclosure are described in the context of example illegal vector sequences generated for a simple example circuit design depicted in FIG. 1 (hereinafter, "the illustrated example"). However, the use of the example circuit design and example illegal vector sequences should be considered illustrative only and are non-limiting. Using the guidelines provided herein, the described techniques can be utilized for verification of any of a variety of circuit designs substantially more complex without departing from the scope of the present disclosure.

The term "vector sequence," as used herein, refers to a sequence of input values for corresponding inputs of a circuit or circuit design for one or more cycles of operation. For ease of reference, the circuit inputs in a vector sequence are represented by a sequence of ones (1), zeros (0), and in certain instances the Boolean variable X, which represents either a one or a zero (i.e., "don't care"). To illustrate, assume that a circuit has three inputs involved in the analysis: inputs $I_1$, $I_2$, and $I_3$. The vector sequence {101 001} indicates that for a cycle i the input $I_1$ receives a "1", the input $I_2$ receives a "0" and the input $I_3$ receives a "1", and for the next cycle i+1, the input $I_1$ receives a "0", the input $I_2$ receives a "0" and the input $I_3$ receives a "1" (the space between vectors in the vector sequence identifies the transition between cycles). The term "illegal vector sequence," as used herein, refers to a vector sequence that results in one or more non-deterministic output values.

FIG. 1 illustrates an example circuit design 100 for which the techniques of the present disclosure may be employed in accordance with at least one embodiment of the present disclosure. The circuit design 100 depicts a conventional clock gater, which includes an input 102 to receive a clock signal MCLK, an input 103 to receive a signal Gtr_B, an input 104 to receive a signal En, an output 106 to provide an output clock signal CLK_A, and transistors 108-113 and an inverter 114 connected between the inputs 102-104, the output 106, a voltage $V_{dd}$, and a voltage $V_{ss}$ as illustrated. The clock gater represented by the circuit design 100 is intended to operate such that if both the signal En and the signal Gtr_B are asserted (i.e., both logic "1" in the example of FIG. 1), the clock signal CLK_A is generated at the output 106 based on the clock signal MCLK received at the input 104. However, additional issues arise when a series of cycles of inputs to the circuit design 100 are considered. To illustrate, if the signals En and Gtr_B both are at logic "1" at a cycle i and the signal MCLK is also logic "1" (i.e., for cycle i: En=1, Gtr_B=1, MCLK=1) then the output 106 (i.e., signal CLK_A) also will be logic "1". For the next cycle i+1, assume the signal En goes to logic "0" while the signal Gtr_B and the signal MCLK both remain at logic "1" (e.g., for cycle i+1: En=0, Gtr_B=1, MCLK=1). In this situation, the ideal circuit typically would operate such that the output 106 would be driven to logic "0". However, due to the above-described sequence of input values for cycles i and i+1, the output 106 can inadvertently change from logic "1" to logic "0" and then back to logic "1" all within one cycle. Thus, this sequence of input values for the two successive cycles can cause the output 106 of an actual circuit to be indeterminate (i.e., either "0" or "1"—denoted as the Boolean variable X). Accordingly, the vector sequence {111 011} (for the vector configuration {En-Gtr_B-MCLK}) is an illegal vector sequence.

Figure 2:
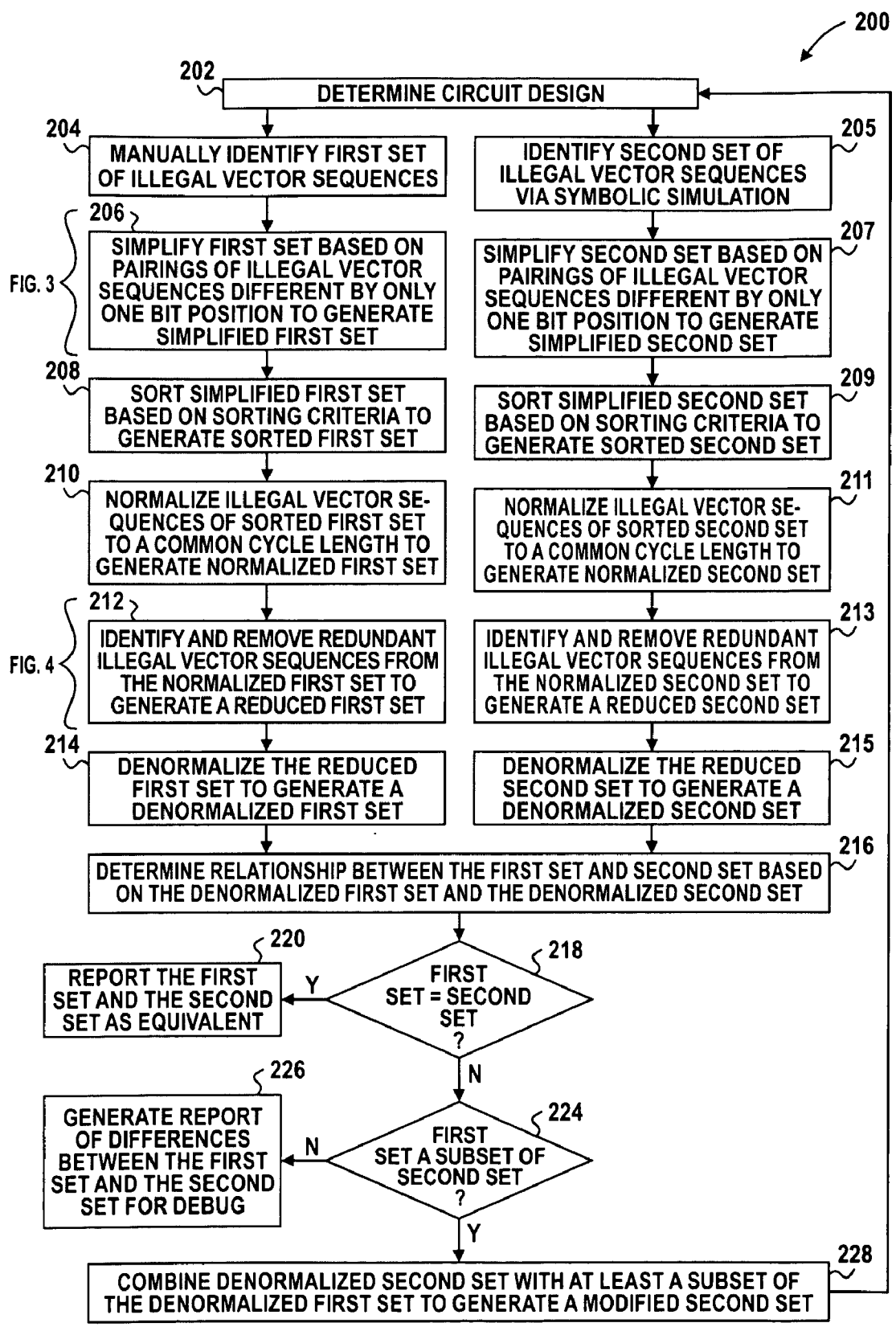
FIG. 2 is a flow diagram illustrating an example method for verifying sets of illegal vector sequences for a circuit design in accordance with at least one embodiment of the present disclosure.
Figure 3:
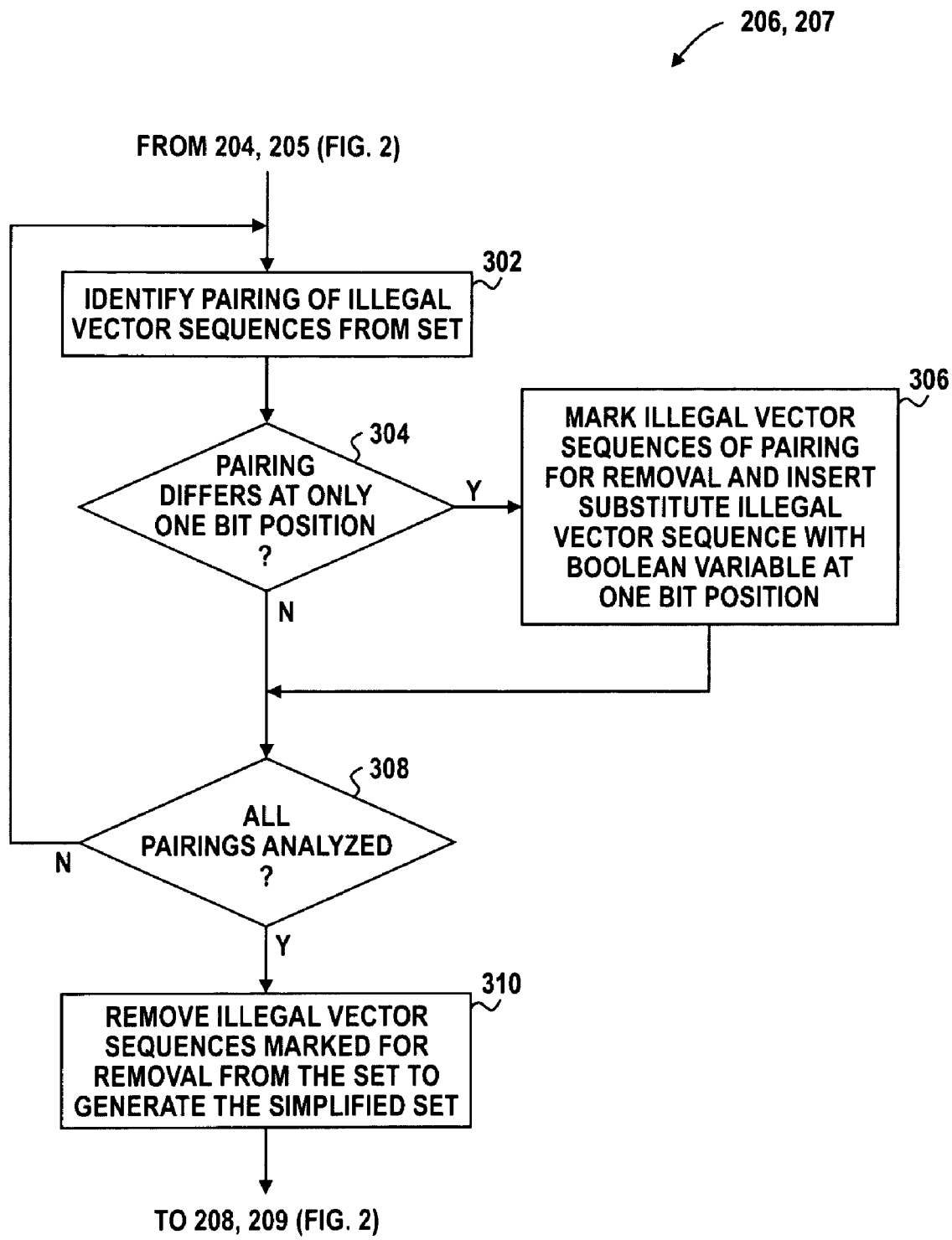
FIG. 3 is a flow diagram illustrating an example method for simplifying a set of illegal vector sequences for a circuit design based on hamming distances between pairs of illegal vector sequences in accordance with at least one embodiment of the present disclosure.
Figure 4:
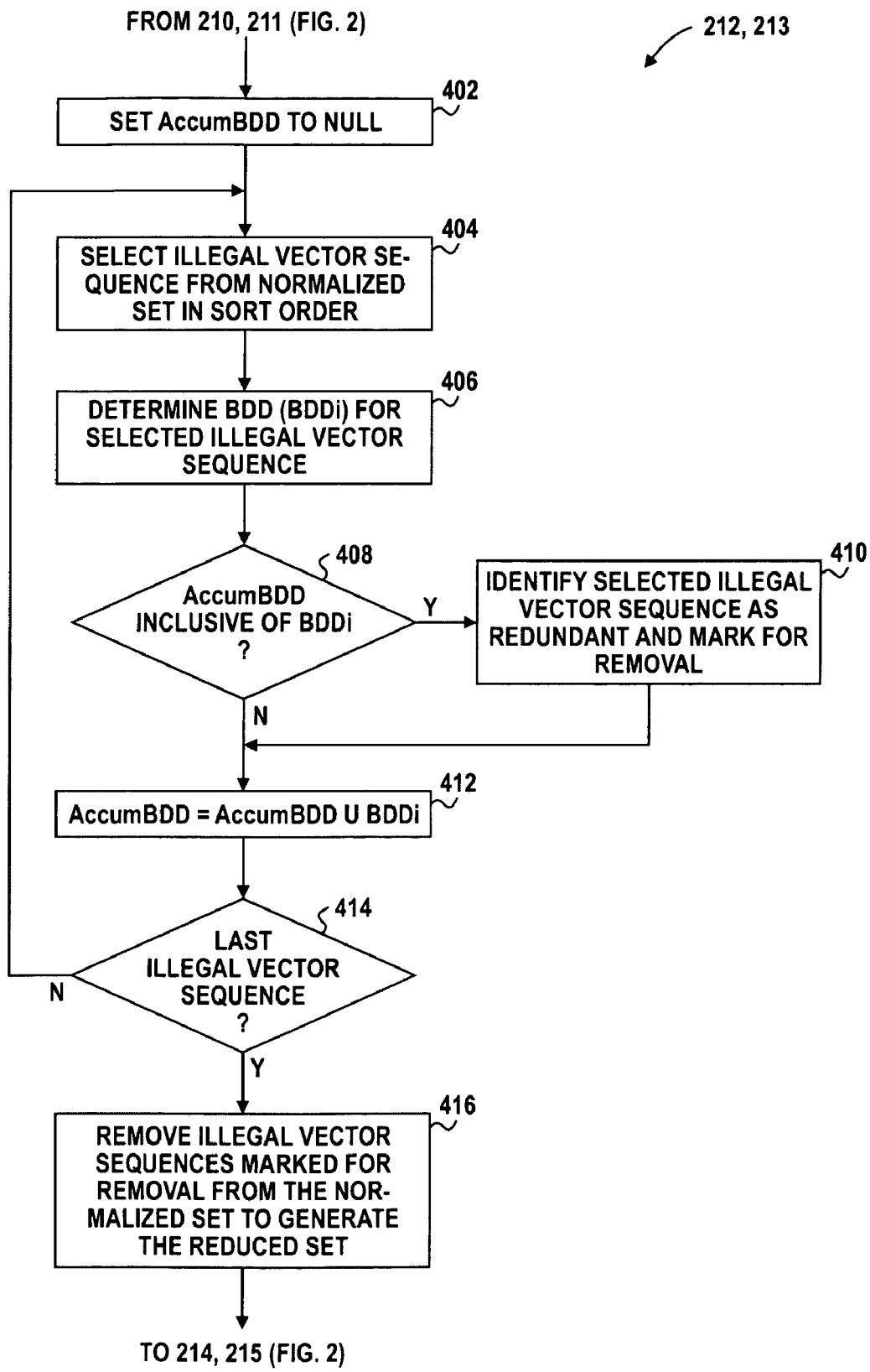
FIG. 4 is a flow diagram illustrating an example method for simplifying a set of illegal vector sequences for a circuit design based on binary decision diagram representations of the illegal vector in accordance with at least one embodiment of the present disclosure.

In any given circuit design, there may be any given number of illegal vector sequences and thus it is often desirable to identify all of the illegal vector sequences (or at least as many as is feasible) and to configure any other circuitry providing any inputs to a circuit implemented by the circuit design so as to avoid providing a sequence of inputs for one or more cycles that constitutes one of the illegal vector sequences. As discussed herein, a conventional process for identifying a set of illegal vector sequences manually (typically by the designer of the circuit) and identifying another set of illegal vector sequences via symbolic simulation, and then comparing the two sets of illegal vector sequences to determine whether it is likely that most if not all illegal vector sequences have been identified. FIGS. 2-4 illustrate example methods for simplifying the sets of illegal vector sequences thus identified so as to reduce the memory and processing requirements to make such a determination. The methods are implemented via a processing system, an example of which is described below with respect to FIG. 5.

FIG. 2 illustrates an example method 200 for verifying illegal vector sequences of a circuit design in accordance with at least one embodiment of the present disclosure. At block 202, a circuit designer determines a circuit design, which may be represented in any of a variety of formats, such as a Verilog™ RTL (register transfer level) file, etc. The simple example circuit design 100 of FIG. 1 is utilized in the discussion of the method 200 to illustrate a simplified example operation of the method 200.

At block 204, the design engineer or another party manually identifies a set of illegal vector sequences based on past experience, knowledge of the operation of actual circuit devices, etc. This set is identified for purposes of the following discussion as the "first set," but this set not necessarily correlate to any "first set" recited by the claims. At block 205, the circuit design is subjected to symbolic simulation to generate another set of illegal vector sequences. This set is identified for purposes of the following discussion as the "second set," but this set does not necessarily correlate to any "second set" recited by the claims. An example of a symbolic simulator suitable for generation of illegal vector sequences includes the ESP-CV™ Functional Verification Tool provided by Synopsys, Inc. of Mountain View, Calif.

For the example used herein, assume that, for the circuit design 100, the first set of illegal vector sequences manually generated at block 204 are represented by Table 1 and the second set of illegal vector sequences automatically generated at block 205 are represented by Table 2 (for vector {En, Gtr_B, MCLK}). Note that the example second set includes illegal vector sequences of different cycle lengths (e.g., two cycles and three cycles).

TABLE 1

| First Set |
| --- |
| 111 0X1 |
| 111 X01 |
| 111 001 |

TABLE 2

| Second Set |
| --- |
| 111 101 |
| 111 0X1 |
| 111 XX1 101 |
| 111 XX1 0X1 |
| 110 111 101 |
| 110 111 0X1 |
| 10X 111 101 |
| 10X 111 0X1 |
| 0XX 111 101 |
| 0XX 111 0X1 |

At block 206, the first set of illegal vector sequences is simplified by identifying pairings of illegal vector sequences having a hamming distance of only one (1) (e.g., different from each other at only one bit position) and replacing the pair with a substitute illegal vector sequence that represents both illegal vector sequences by using the Boolean variable X in the bit position in which the pair differ. The resulting set of illegal vector sequences is identified herein as the simplified first set of illegal vector sequences. At block 207, the second set of illegal vector sequences is simplified in the same manner to generate a simplified second set of illegal vector sequences. This simplification process can be viewed as a modification to the initial step of the Quine-McClusky algorithm so as to simplify Boolean equations.

FIG. 3 illustrates an example implementation of the simplification process of blocks 206 and 207 of method 200 in accordance with at least one embodiment of the present disclosure. For purposes of discussion, FIG. 3 is described with respect to simplifying a "set", which can represent either the first set or the second set of FIG. 2.

At block 302, a pairing of illegal vector sequences of the same cycle length is identified from the set. The process of identifying a pairing of illegal vector sequences may depend on the data structure(s) used to represent the set of illegal vector sequences. To illustrate, in one embodiment, the illegal vector sequences of the set are sorted and ordered based on cycle length first so that the illegal vector sequences of the set having a given cycle length are organized in a single contiguous block.

After a pairing has been identified, at block 304 the hamming distance between the two illegal vector sequences of the pairing is determined using any of a variety of hamming distance algorithms. A hamming distance of one (1) indicates that the two illegal vector sequences differ at only on bit position. Accordingly, if the hamming distance is one, at block 306 a substitute illegal vector sequence is inserted into the set for the pairing, whereby the substitute illegal vector sequence utilizes the Boolean variable at the bit position where the two illegal vector sequences differ. To illustrate, for two vector sequences {101 001} and {101 101}, they differ only at the fourth bit position (i.e., the first input value of the second cycle) and thus can be replaced by the substitute illegal vector sequence (101 X01), which reduces the number of illegal vector sequences in the set by one. Further, in one embodiment, at block 306 the two illegal vector sequences of the pairing are marked for deletion but are not immediately removed from the set so that they can be utilized in alternate pairings at further iterations of the process of FIG. 3. To illustrate, assume there are three vector sequences {101 001}, {101 101} and (001 001}. It can be seen that the vector sequence {101 001} is within a hamming distance of one of both the vector sequence {101 101} and the vector sequence {001 001}. Thus, if the vector sequence {101 001} were immediately deleted when the substitute illegal vector sequence {101 X01} was inserted, the other pairing {101 001} {001 001} would not have been identified and thus a second substitute illegal vector sequence {X01 001} would not have been generated.

Upon completion of the process at block 306, or if the hamming distance is greater than one, the process flows to block 308. At block 308, it is determined whether every pairing of illegal vector sequences of the same cycle length has been analyzed. If not, flow returns to block 302 and the next pairing is identified and the process of blocks 304-308 is repeated for the next pairing. Once all pairings have been analyzed, at block 310 the illegal vector sequences marked for deletion at the one or more iterations of block 306 are removed from the set to generate a simplified set.

For the illustrative example, the application of the process of block 206 to the first set of Table 1 results in the simplified first set of Table 3 below and the application of the process of block 207 to the second set of Table 2 results in the simplified second set of Table 4. However, the second set of Table 2 does not have any pairings of illegal vector sequences that differ by only one bit position, so the resulting reduced second set of Table 3 is not changed from the second set before simplification (i.e., the simplified first set of Table 3 remains the first set of Table 1).

TABLE 3

Simplified First Set 111 0X1
111 X01

TABLE 4

Simplified Second Set 111 101
111 0X1
111 XX1 101
111 XX1 0X1
110 111 101
110 111 0X1
10X 111 101
10X 111 0X1
0XX 111 101
0XX 111 0X1

Returning to method 200 of FIG. 2, the simplified first set generated at block 206 is sorted at block 208 based on predetermined sorting criteria to generate a sorted first set, whereby the illegal vector sequences of the sorted first set are arranged in a first sort order. Likewise, the simplified second set generated at block 207 is sorted at block 209 based on the predetermined sorting criteria to generate a sorted second set, whereby the illegal vector sequences of the sorted second set are arranged in a second sort order. In at least one embodiment, the sorting criteria is intended to sort the illegal vector sequences of a set such that broader, or more general, illegal vector sequences have a higher priority in the sort order (i.e., appear earlier in the sort order) than narrower, or less general, illegal vector sequences. As illegal vector sequences having a shorter cycle length are broader than illegal vector sequences having a longer cycle length, and as illegal vector sequences of a given length that have more Boolean variables are broader than illegal vector sequences of the same cycle length that have fewer Boolean variables, the sort criteria, in one embodiment, includes: firstly, prioritizing those illegal vector sequences having fewer cycles than those having more cycles; and once sorted based on cycle length, sorting the illegal vector sequences such that the illegal vector sequences for a given cycle length that have more Boolean variables have a higher priority in the sort order than those illegal vector sequences of the given cycle length that have fewer Boolean variables. As described in greater detail below, the purpose of sorting the illegal vector sequences based on this sorting criteria is to improve the efficiency of the process of identifying redundant illegal vector sequences based on the use of binary decision diagrams, and the sorting of the illegal vector sequences allows the broadest illegal vector sequences to be accumulated in a joint BDD first.

Tables 5 and 6 illustrate the resulting sorted first set and the sorted second set, respectively, generated from the simplified first set and simplified second set of Tables 3 and 4 respectively.

TABLE 5

Sorted First Set 111 0X1
111 X01

TABLE 6

Sorted Second Set 111 0X1
111 101
111 XX1 0X1
0XX 111 0X1
111 XX1 101
10X 111 0X1
0XX 111 101
110 111 0X1
10X 111 101
110 111 101

At block 210, the illegal vector sequences of the sorted first set are normalized to a common cycle length (i.e., to the longest cycle length present from the sorted first set or the sorted second set) by using sets of the Boolean variable X to fill in cycles in illegal vector sequences having a cycle length less than the common cycle length. The resulting set is identified herein as the normalized first set. At block 211, this normalization process is performed using the sorted second set to generate a normalized second set having the common cycle length. Note that this normalization process results in the generation of two or more normalized illegal vector sequences for each illegal vector sequence having a cycle length less than the common cycle length because the Boolean variable fill-in cycles are placed in front for one version and in back for the second version (and in intermediate positions for implementations having illegal vector sequences having more than three cycles). To illustrate, assume that the illegal vector sequence {111 000} is to be normalized to a cycle length of three. The normalization process therefore would generate two normalized illegal vector sequences: {XXX 111 000} and {111 000 XXX}.

Tables 7 and 8 illustrate the resulting normalized first set and the normalized second set, respectively, generated from the sorted first set and the sorted second set of Tables 5 and 6 respectively.

TABLE 7

Normalized First Set 111 0X1 XXX
XXX 111 0X1
111 X01 XXX
XXX 111 X01

TABLE 8

Normalized Second Set 111 0X1 XXX
XXX 111 0X1
111 101 XXX
XXX 111 101
111 XX1 0X1
0XX 111 0X1
111 XX1 101
10X 111 0X1
0XX 111 101
110 111 0X1
10X 111 101
110 111 101

The sorting process of blocks 208 and 209 and the normalization process of blocks 210 and 211 result in a sort order of the illegal vector sequences of the first and second normalized sets such that those illegal vector sequences with the most Boolean variables (i.e., the broadest illegal vector sequences) have the highest priority (i.e., appear first) in the corresponding sort order, while those illegal vector sequences with the fewest Boolean variables (i.e., the narrowest illegal vector sequences) have the lowest priority (i.e., appear last) in the corresponding sort order.

At block 212, those illegal vector sequences of the normalized first set that are redundant in view of a combination of one or more other illegal vector sequences of the normalized first set are identified and removed from the normalized first set to generate a reduced first set. Likewise, at block 213, those illegal vector sequences of the normalized second set that are redundant in view of a combination of one or more other illegal vector sequences of the normalized second set are identified and removed from the normalized second set to generate a reduced second set.

FIG. 4 illustrates an example implementation of the process of blocks 212 and 213 of method 200 in accordance with at least one embodiment of the present disclosure. For purposes of discussion, FIG. 4 is described with respect to reducing a "set", which can represent either the first set or the second set of FIG. 2.

To summarize the process of FIG. 4, the process utilizes the binary decision diagrams (BDD) to identify redundant illegal vector sequences in a set. BDDs are efficient data structures for representing a Boolean function (i.e., those illegal vector sequences of the normalized set that include one or more instances of the Boolean variable X). In at least one embodiment, the BDD for a given illegal vector sequence is generated and then compared with an accumulated BDD that represents the union (∪) of all of the BDDs generated for each of the illegal vector sequences that appear prior to the given illegal vector sequence in the sort order of the normalized set. If the accumulated BDD is inclusive of the BDD generated for the given illegal vector sequence (i.e., accumulated BDD ⊂ BDD of given illegal vector sequence), the given illegal vector sequence is redundant in view of one or more illegal vector sequences that appear prior to the given illegal vector sequence in the sort order of the normalized set, and thus the given illegal vector sequence can be removed. Otherwise, if the accumulated BDD is not inclusive of the BDD generated for the given illegal vector sequence, the given illegal vector sequence is maintained in the set.

Turning to the illustrated flow diagram, at block 402, the accumulated binary decision diagram (BDD), AccumBDD, is initialized by, for example, setting it to NULL. At block 404, the highest-priority illegal vector sequence of the normalized set based on the sort order that has not yet been selected is selected. For purposes of explanation, it is assumed that the normalized set is sorted in a sort order such that the broadest illegal vector sequence (i.e., the illegal vector sequence with the most Boolean variables of illegal vector sequences) is listed first (at the top of the Tables) and the narrowest illegal vector sequence (i.e., the illegal vector sequences with the fewest Boolean variables) is listed last (at the bottom of the Tables). Accordingly, for the first iteration of block 404, the illegal vector sequence listed first in the normalized set is selected, for the second iteration of block 404, the illegal vector sequence listed second in the normalized set is selected, and so forth.

At block 406, the BDD (identified as BDDi) for the selected illegal vector sequence is determined based on any of a variety of BDD algorithms. At block 408, the accumulated BDD (AccumBDD) is compared with the BDD of the selected illegal vector (BDDi) to determine whether the accumulated BDD is inclusive of the BDD of the selected illegal vector (i.e., whether AccumBDD ⊂ BDDi). For the first iteration of the process of FIG. 4, AccumBDD is initialized to NULL and therefore will not be inclusive of BDDi. For the second and subsequent iterations, if AccumBDD is inclusive of BDDi, at block 410 the selected illegal vector sequence is identified as redundant and is marked for removal. Otherwise, if AccumBDD is not inclusive of BDDi the selected illegal vector sequence is not redundant and the method flows to block 412.

At block 412, the accumulated BDD is set to the union of the accumulated BDD with the BDD of the selected illegal vector sequence (i.e., AccumBDD=AccumBDD ∪ BDDi). In other words, the BDD of the selected illegal vector sequence for a given iteration of the process of FIG. 4 is accumulated with the BDDs of the one or more illegal vector sequences of broader scope that were selected in prior iterations of the process of FIG. 4.

At block 414, it is determined whether the last illegal vector sequence of the sort order of the normalized set has been processed. If not, the process returns to block 404 whereby the next illegal vector sequence in the sort order is selected and analyzed for redundancy during the next iteration of blocks 404-414. Otherwise, at block 416, those illegal vector sequences marked for deletion at iterations of block 410 as being redundant are removed from the normalized set to generate a reduced set.

Tables 9 and 10 illustrate the resulting reduced first set and the reduced second set, respectively, generated from the normalized first set and the normalized second set of Tables 7 and 8 respectively. Note the significant reduction in illegal vector sequences listed in the reduced second set of Table 10 compared to the normalize second set of Table 8 prior to reduction.

TABLE 9

| Reduced First Set |
| --- |
| 111 0X1 XXX |
| XXX 111 0X1 |
| 111 X01 XXX |
| XXX 111 X01 |

TABLE 10

| Reduced Second Set |
| --- |
| 111 0X1 XXX |
| XXX 111 0X1 |
| 111 101 XXX |
| XXX 111 101 |

Returning to method 200 of FIG. 2, the reduced first set generated at block 212 is denormalized at block 214 to generate a denormalized first set. Likewise, the reduced second set generated at block 213 is denormalized at block 215 to generate a denormalized second set. The denormalization process is the inverse of the normalization process described above, whereby cycles composed entirely of the Boolean variable X are removed, and any resulting duplicate illegal vector sequences are removed. Tables 11 and 12 illustrate the resulting denormalized first set and the denormalized second set, respectively, generated from the reduced first set and the reduced second set of Tables 9 and 10, respectively.

TABLE 11

| Denormalized First Set |
| --- |
| 111 0X1 |
| 111 X01 |

TABLE 12

| Denormalized Second Set |
| --- |
| 111 0X1 |
| 111 101 |

At this point, the first and second sets have been sufficiently simplified to permit them to be efficiently compared to determine the relationship between the first set and the second set. For small sets, this comparison can be manually determined by the design engineer or other party. To illustrate, from the simple illustrative example of Tables 11 and 12, it can be seen that the illegal vector sequence {111 0X1} is present in both the denormalized first set and the denormalized second set, and the other illegal vector sequence {111 X01} of the denormalized first set is inclusive of the other illegal vector sequence {111 101} of the denormalized second set. Thus, the design engineer can identify the manually determined first set as inclusive of the automatically generated second set (i.e., first set ⊂ second set). In most instances, however, the number of illegal vector sequences in the resulting simplified sets will remain too large to permit manual comparison and therefore the comparison of the resulting sets can be performed via a software algorithm implemented via a processing system. An example commercially-available software program commonly utilized to compare two BDDs includes the Colorado University Decision Diagram (CUDD) package available from the University of Colorado at Boulder.

In the event that the denormalized first set is determined to be equivalent to the denormalized second set at block 218, at block 220 the first set and the second set are reported as equivalent, thereby indicating that the design engineer and the symbolic simulator agree on the illegal vector sequences.

If the relationship between the denormalized first set and the denormalized second set reveals at block 224 that the first set is not a subset of the second set (and the first set and the second set are not equal from block 218), then it is likely that an error occurred in one or both of the design engineer's analysis of the circuit design or the symbolic simulator's analysis of the circuit design. Accordingly, at block 226 a report of this discrepancy is produced. The report further can include a listing of the differences between the first set and the second set so as to facilitate troubleshooting.

Otherwise, if the relationship between the denormalized first set and the denormalized second set reveals at block 224 that the first set is a subset of the second set, then it may be possible to utilize some or all of the illegal vector sequences of the manually-generated first set to further simplify the second set. This is due to the design engineer, while having a better understanding of the circuit design, may utilize illegal vector sequences that are more easily interpreted, and thus the design engineer may miss certain patterns of illegal vector sequences. Accordingly, at block 228 illegal vector sequences from the first set are used as "hints" by combining them with the illegal vector sequences of the second set to generate an expanded second set. In one embodiment, all of the illegal vector sequences of the first set can be combined with the second set to generate the expanded second set. In another embodiment, only a certain number of the broadest (i.e., highest priority) illegal vector sequences of the first set are combined with the second set to generate the expanded second set. The expanded second set then is simplified, sorted, normalized, reduced by removing redundant illegal vector sequences, and then denormalized for a second iteration of the process of blocks 207, 209, 211, 213, and 215 using the expanded second set. The relationship between the resulting set and the denormalized first set is determined and processed accordingly as previously described at blocks 216, 218, 220, 224, and 226. As can be seen from Tables 11 and 12 for the illustrated example, the first set and the second set are equivalent.

Figure 5:
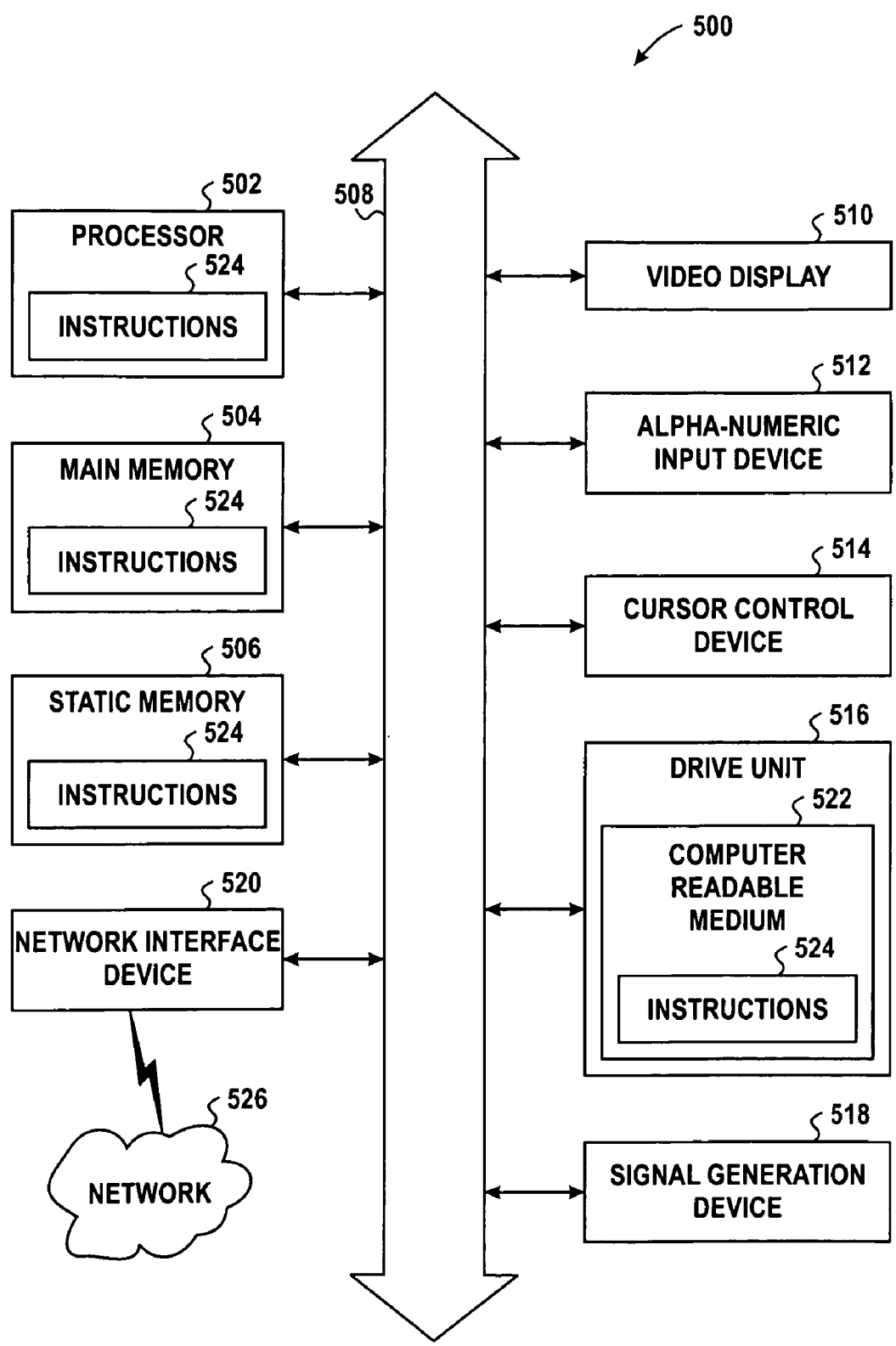
FIG. 5 is a diagram of a processing system for implementing the example methods of FIGS. 2-4 in accordance with at least one embodiment of the present disclosure.

FIG. 5 illustrates a processing system 500 in accordance with at least one embodiment of the present disclosure. The processing system 500 can include a set of instructions that can be executed to manipulate the processing system 500 to perform any one or more of the methods or functions disclosed above. The processing system 500 may operate as a standalone device or may be connected, e.g., using a network, to other processing systems or peripheral devices.

In a networked deployment, the processing system may operate in the capacity of a server or as a client user computer in a server-client user network environment, or as a peer processing system in a peer-to-peer (or distributed) network environment. Further, while a single processing system 500 is illustrated, the term "system" shall also be taken to include any collection of systems or sub-systems that individually or jointly execute a set, or multiple sets, of instructions to perform one or more computer functions.

The processing system 500 may include one or more processors 502, e.g., a central processing unit (CPU), a graphics processing unit (GPU), or both. Moreover, the processing system 500 can include a main memory 504 and a static memory 506 that can communicate with each other via a bus 508. As shown, the processing system 500 may further include a video display unit 510, such as a liquid crystal display (LCD), an organic light emitting diode (OLED), a flat panel display, a solid state display, or a cathode ray tube (CRT). Additionally, the processing system 500 may include an input device 512, such as a keyboard, and a cursor control device 514, such as a mouse. The processing system 500 can also include a disk drive unit 516, a signal generation device 518, such as a speaker, and a network interface device 520.

In a particular embodiment, as depicted in FIG. 5, the disk drive unit 516 may include a computer readable storage device 522 in which one or more sets of instructions 524, e.g. software, can be embedded. Further, the instructions 524 may embody one or more of the methods or logic as described herein. In a particular embodiment, the instructions 524 may reside completely, or at least partially, within the main memory 504, the static memory 506, and/or within the processor 502 during execution by the processing system 500. The main memory 504 and the processor 502 also may include computer readable media. The network interface device 520 can provide connectivity to a network 526, e.g., a wide area network (WAN), a local area network (LAN), or other network.

In accordance with various embodiments of the present disclosure, the methods described herein may be implemented, in whole or in part, by software programs executable by the processing system 500. The present disclosure contemplates a computer readable storage device (e.g., the main memory 504, the static memory 506, or the drive unit 516) that includes instructions 524or receives and provides instructions 524 for execution. Further data representative of the sets of illegal vector sequences can be stored in one or more of the computer readable storage device for access by the processing system 500 during execution of the instructions 524 so as to implemented the methods described above.

While the computer readable storage device is shown to be a single storage device, the term "computer readable storage device" includes a single storage device or multiple storage devices, such as a centralized or distributed database, and/or associated caches and servers that store one or more sets of instructions. The term "computer readable storage device" shall also include any storage device that is capable of storing a set of instructions for execution by a processor or that cause a processing system to perform any one or more of the methods or operations disclosed herein.

In a particular non-limiting, exemplary embodiment, the computer readable storage device can include a solid-state memory such as a memory card or other package that houses one or more non-volatile read-only memories. Further, the computer readable storage device can be a random access memory or other volatile re-writeable memory. Additionally, the computer readable storage device can include a magneto-optical or optical medium, such as a disk or tapes or other storage device.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and processing systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In this document, relational terms such as "first" and "second", and the like, may be used solely to distinguish one entity or action from another entity or action without necessarily requiring or implying any actual relationship or order between such entities or actions or any actual relationship or order between such entities and claimed elements. The term "another", as used herein, is defined as at least a second or more. The terms "including", "having", or any variation thereof, as used herein, are defined as comprising.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof.

What is claimed is:

1. A method comprising:
receiving, at a processing system, a first data representative of a first set of illegal vector sequences for a circuit design;
for each pairing of illegal vector sequences of the first set that differ at only one bit position, inserting, at the processing system, a substitute illegal vector sequence into the first set, the substitute illegal vector having a Boolean variable at the one bit position;
removing from the first set each pairing of illegal vector sequences that differ at only one bit position while maintaining each inserted substitute illegal vector sequence to generate a second set of illegal vector sequences at the processing system;
sorting, at the processing system, the second set of illegal vector sequences based on sort criteria to generate a third set of illegal vector sequences having a first sort order;
for each illegal vector sequence of the third set of illegal vector sequences, identifying, at the processing system, the illegal vector sequence for removal in response to determining that a binary decision diagram (BDD) that is a union of each BDD of each illegal vector sequence preceding the illegal vector sequence in the first sort order is inclusive of a BDD of the illegal vector sequence;
removing from the second set of illegal vector sequences illegal vector sequences identified for removal to generate a fourth set of illegal vector sequences at the processing system; and
determining, at the processing system, a relationship between the first set of illegal vector sequences and a fifth set of illegal vector sequences for the circuit design based on the fourth set of illegal vector sequences.

2. The method of claim 1, further comprising:
receiving, at the processing system, a second data representative of the fifth set of illegal vector sequences;
for each pairing of illegal vector sequences of the fifth set that differ at only one bit position, inserting, at the processing system, a substitute illegal vector sequence into the fifth set, the substitute illegal vector having a Boolean variable at the one bit position;

removing from the fifth set each pairing of illegal vector sequences that differ at only one bit position while maintaining each inserted substitute illegal vector sequence to generate a sixth set of illegal vector sequences at the processing system;

sorting, at the processing system, the sixth set of illegal vector sequences based on the sort criteria to generate a seventh set of illegal vector sequences having a second sort order;

for each illegal vector sequence of the seventh set of illegal vector sequence, identifying, at the processing system, the illegal vector sequence for removal in response to determining that a binary decision diagram (BDD) that is a union of each BDD of each illegal vector sequence preceding the illegal vector sequence in the second sort order is inclusive of a BDD of the illegal vector sequence;

removing from the seventh set of illegal vector sequences illegal vector sequences identified for removal to generate an eighth set of illegal vector sequences at the processing system; and wherein determining the relationship between the first set of illegal vector sequences and the fifth set of illegal vector sequences comprises determining the relationship based on a relationship between the fourth set of illegal vector sequences and the eighth set of illegal vector sequences.

3. The method of claim 1, further comprising:
normalizing, at the processing system, each illegal vector sequence of the third set to a predetermined cycle length.

4. The method of claim 3, further comprising:
denormalizing, at the processing system, each illegal vector sequence of the fourth set by removing any cycles composed entirely of Boolean variables from the illegal vector sequence.

5. The method of claim 1, wherein:
the first set of illegal vector sequences comprises a set of illegal vector sequences for the circuit design identified manually;
the fifth set of illegal vector sequences comprises a set of illegal vector sequences for the circuit design identified via symbolic simulation.

6. The method of claim 5, further comprising:
determining, at the processing system, whether an error is present in at least one of the first set or the fifth set based on the relationship between the first set and the fifth set.

7. The method of claim 1, further comprising:
combining, at the processing system, the fourth set of illegal vector sequences with at least a subset of the fifth set of illegal vector sequences to generate a sixth set of illegal vector sequences;

for each pairing of illegal vector sequences of the sixth set that differ at only one bit position, inserting, at the processing system, a substitute illegal vector sequence into the sixth set, the substitute illegal vector having a Boolean variable at the one bit position;

removing from the sixth set each pairing of illegal vector sequences that differ at only one bit position while maintaining each inserted substitute illegal vector sequence to generate a seventh set of illegal vector sequences at the processing system;

sorting, at the processing system, the seventh set of illegal vector sequences based on the sort criteria to generate an eighth set of illegal vector sequences having a second sort order;

for each illegal vector sequence of the eighth set of illegal vector sequences, identifying, at the processing system, the illegal vector sequence for removal in response to determining that a binary decision diagram (BDD) that is a union of each BDD of each illegal vector sequence preceding the illegal vector sequence in the second sort order is inclusive of a BDD of the illegal vector sequence;

removing from the eighth set of illegal vector sequences illegal vector sequences identified for removal to generate a ninth set of illegal vector sequences at the processing system; and wherein determining the relationship between the first set of illegal vector sequences and the fifth set of illegal vector sequences comprises determining the relationship based on the ninth set of illegal vector sequences.

8. A computer readable storage device storing a set of instructions, the set of instructions configured to manipulate one or more processors to:

receive a first data representative of a first set of illegal vector sequences for a circuit design;

for each pairing of illegal vector sequences of the first set that differ at only one bit position, insert a substitute illegal vector sequence into the first set, the substitute illegal vector having a Boolean variable at the one bit position;

remove from the first set each pairing of illegal vector sequences that differ at only one bit position while maintaining each inserted substitute illegal vector sequence to generate a second set of illegal vector sequences;

sort the second set of illegal vector sequences based on sort criteria to generate a third set of illegal vector sequences having a first sort order;

for each illegal vector sequence of the third set of illegal vector sequence, identify the illegal vector sequence for removal in response to determining that a binary decision diagram (BDD) that is a union of each BDD of each illegal vector sequence preceding the illegal vector sequence in the first sort order is inclusive of a BDD of the illegal vector sequence;

remove from the second set of illegal vector sequences illegal vector sequences identified for removal to generate a fourth set of illegal vector sequences; and determine a relationship between the first set of illegal vector sequences and a fifth set of illegal vector sequences for the circuit design based on the fourth set of illegal vector sequences.

9. The computer readable storage device of claim 8, the set of instructions further configured to manipulate the one or more processors to:

receive a second data representative of the fifth set of illegal vector sequences;

for each pairing of illegal vector sequences of the fifth set that differ at only one bit position, insert a substitute illegal vector sequence into the fifth set, the substitute illegal vector having a Boolean variable at the one bit position;

remove from the fifth set each pairing of illegal vector sequences that differ at only one bit position while maintaining each inserted substitute illegal vector sequence to generate a sixth set of illegal vector sequences;

sort the sixth set of illegal vector sequences based on the sort criteria to generate a seventh set of illegal vector sequences having a second sort order;

for each illegal vector sequence of the seventh set of illegal vector sequences, identify the illegal vector sequence for removal in response to determining that a binary decision diagram (BDD) that is a union of each BDD of each illegal vector sequence preceding the illegal vector sequence in the second sort order is inclusive of a BDD of the illegal vector sequence;
remove from the seventh set of illegal vector sequences illegal vector sequences identified for removal to generate an eighth set of illegal vector sequences; and
wherein the set of instructions are to manipulate the one or more processors to determine the relationship between the first set of illegal vector sequences and the fifth set of illegal vector sequences by manipulating the one or more processors to determine the relationship based on a relationship between the fourth set of illegal vector sequences and the eighth set of illegal vector sequences.

10. The computer readable storage device of claim 8, the set of instructions further configured to manipulate the one or more processors to:
normalize each illegal vector sequence of the third set to a predetermined cycle length.

11. The computer readable storage device of claim 10, the set of instructions further configured to manipulate the one or more processors to:
denormalize each illegal vector sequence of the fourth set by removing any cycles composed entirely of Boolean variables from the illegal vector sequence.

12. The computer readable storage device of claim 8, wherein:
the first set of illegal vector sequences comprises a set of illegal vector sequences for the circuit design identified manually;
the fifth set of illegal vector sequences comprises a set of illegal vector sequences for the circuit design identified via symbolic simulation.

13. The computer readable storage device of claim 12, the set of instructions further configured to manipulate the one or more processors to:
determine whether an error is present in at least one of the first set or the fifth set based on the relationship between the first set and the fifth set.

14. The computer readable storage device of claim 8, the set of instructions further configured to manipulate the one or more processors to:
combine the fourth set of illegal vector sequences with at least a subset of the fifth set of illegal vector sequences to generate a sixth set of illegal vector sequences;
for each pairing of illegal vector sequences of the sixth set that differ at only one bit position, insert a substitute illegal vector sequence into the sixth set, the substitute illegal vector having a Boolean variable at the one bit position;
remove from the sixth set each pairing of illegal vector sequences that differ at only one bit position while maintaining each inserted substitute illegal vector sequence to generate a seventh set of illegal vector sequences;
sort the seventh set of illegal vector sequences based on the sort criteria to generate an eighth set of illegal vector sequences having a second sort order;
for each illegal vector sequence of the eighth set of illegal vector sequences, identify the illegal vector sequence for removal in response to determining that a binary decision diagram (BDD) that is a union of each BDD of each illegal vector sequence preceding the illegal vector sequence in the second sort order is inclusive of a BDD of the illegal vector sequence;
remove from the eighth set of illegal vector sequences illegal vector sequences identified for removal to generate a ninth set of illegal vector sequences; and
wherein the set of instructions are to manipulate the one or more processors to determine the relationship between the first set of illegal vector sequences and the fifth set of illegal vector sequences by manipulating the one or more processors to determine the relationship based on the ninth set of illegal vector sequences.

* * * * *